United States Patent
Hechtfischer et al.

(10) Patent No.: US 9,423,481 B2
(45) Date of Patent: Aug. 23, 2016

(54) CALIBRATION UNIT FOR A MEASUREMENT DEVICE

(75) Inventors: Gerd Hechtfischer, Vaterstetten (DE); Wilhelm Hohenester, Munich (DE); Rupert Huber, Dorfen (DE); Ralf Jünemann, Munich (DE); Christian Pinta, Munich (DE); Monika Völk, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 265 days.

(21) Appl. No.: 13/821,870

(22) PCT Filed: Aug. 17, 2011

(86) PCT No.: PCT/EP2011/064121
§ 371 (c)(1),
(2), (4) Date: Apr. 11, 2013

(87) PCT Pub. No.: WO2012/034803
PCT Pub. Date: Mar. 22, 2012

(65) Prior Publication Data
US 2013/0221984 A1    Aug. 29, 2013

(30) Foreign Application Priority Data
Sep. 17, 2010 (DE) .......... 10 2010 045 780

(51) Int. Cl.
*G01R 35/00* (2006.01)
*H01P 1/24* (2006.01)
(Continued)

(52) U.S. Cl.
CPC .......... *G01R 35/005* (2013.01); *G01R 35/007* (2013.01); *H01P 1/24* (2013.01);
(Continued)

(58) Field of Classification Search
CPC ...... G01R 35/005; G01R 27/28; G01R 27/32; G01R 35/00; G01R 1/28
USPC ............. 324/601, 755.02, 538; 439/578, 581, 439/584, 675, 851, 289, 63, 750; 333/22 R, 333/81 R, 81 A; 343/725; 361/760; 174/253; 219/27; 606/33
See application file for complete search history.

(56) References Cited

U.S. PATENT DOCUMENTS 2,510,614 A * 6/1950 Weber ............... H01P 1/225
333/35
2,561,184 A * 7/1951 Dehn ............... H01P 1/225
333/81 A (Continued)

FOREIGN PATENT DOCUMENTS

DE 2042821 A1 3/1972
DE WO2004023596 A1 3/2004

(Continued)

*Primary Examiner* — Jermele M Hollington
*Assistant Examiner* — Suresh K Rajaputra
(74) *Attorney, Agent, or Firm* — Potomac Technology Law, LLC

(57) ABSTRACT

A calibration unit for a measurement device for connecting to a connector embodied in a coaxial manner. The calibration unit provides a housing and an inner conductor, whereas the inner conductor (15) is embodied centered within an aperture of the housing. The calibration unit provides a connecting element, that the connecting element is inserted into the aperture of the housing and hosts the inner conductor and that the connecting element is embodied in an elastic manner and supports the inner conductor in an elastic manner relative to the housing.

17 Claims, 8 Drawing Sheets

(51) Int. Cl.
*H01R 13/646* (2011.01)
*H01R 24/40* (2011.01)
*H01R 24/42* (2011.01)
*G01R 3/00* (2006.01)
*H01R 103/00* (2006.01)

(52) U.S. Cl.
CPC ............. *H01R 13/646* (2013.01); *H01R 24/40* (2013.01); *H01R 24/42* (2013.01); *G01R 3/00* (2013.01); *H01R 2103/00* (2013.01); *Y10T 156/108* (2015.01)

(56) References Cited

U.S. PATENT DOCUMENTS

| | | | | | |
|---|---|---|---|---|---|
| 2,606,974 | A * | 8/1952 | Wheeler | | H01P 5/04 324/127 |
| 2,636,120 | A * | 4/1953 | Bird | | G01R 29/10 324/119 |
| 2,968,774 | A | 1/1961 | Rodriguez | | |
| 3,521,201 | A * | 7/1970 | Veteran | | H01P 1/225 333/81 A |
| 3,545,002 | A * | 12/1970 | Fenster | | H01Q 1/38 343/830 |
| 3,683,320 | A * | 8/1972 | Woods | | H01R 9/0521 439/198 |
| 3,744,007 | A * | 7/1973 | Horak | | H01R 9/0521 174/75 C |
| 3,786,374 | A * | 1/1974 | Bergfried | | H03H 7/24 333/238 |
| 4,049,902 | A * | 9/1977 | de Ronde | | H01R 9/05 174/359 |
| 4,091,233 | A * | 5/1978 | Berman | | H01R 4/5033 174/88 R |
| 4,139,936 | A * | 2/1979 | Abrams | | H01B 13/016 156/47 |
| 4,178,054 | A * | 12/1979 | Laudig | | H01R 9/0518 439/394 |
| 4,261,632 | A * | 4/1981 | Narozny | | H01R 24/40 439/393 |
| 4,339,166 | A * | 7/1982 | Dayton | | H01R 24/40 439/393 |
| 4,358,764 | A * | 11/1982 | Cheal | | H01P 5/12 333/127 |
| 4,610,032 | A * | 9/1986 | Miller | | H03D 9/0608 333/246 |
| 4,714,911 | A * | 12/1987 | Di Mino | | H01C 17/2404 29/610.1 |
| 4,734,046 | A * | 3/1988 | McAllister | | G01R 1/073 439/101 |
| 4,797,642 | A * | 1/1989 | Rennard | | G01R 35/005 333/22 R |
| 4,831,346 | A * | 5/1989 | Brooker | | H01B 11/1873 333/244 |
| 4,967,173 | A * | 10/1990 | Watson | | G01R 35/005 333/260 |
| 5,047,737 | A * | 9/1991 | Oldfield | | H01P 5/183 333/22 R |
| 5,052,946 | A * | 10/1991 | Homolka | | H01R 13/53 439/427 |
| 5,066,248 | A * | 11/1991 | Gaver, Jr. | | H01R 9/053 439/394 |
| 5,074,043 | A * | 12/1991 | Mills | | G02G 1/1221 30/90.1 |
| 5,091,709 | A * | 2/1992 | Pollard | | G01R 35/005 333/239 |
| 5,270,493 | A * | 12/1993 | Inoue | | H05K 1/0218 174/253 |
| 5,518,420 | A * | 5/1996 | Pitschi | | H01R 24/564 439/578 |
| 5,524,281 | A * | 6/1996 | Bradley | | G01R 27/28 324/601 |
| 5,704,809 | A * | 1/1998 | Davis | | H01R 13/434 439/349 |
| 5,775,934 | A * | 7/1998 | McCarthy | | H01R 4/5033 439/427 |
| 5,795,188 | A * | 8/1998 | Harwath | | H01R 9/0524 439/583 |
| 5,830,009 | A * | 11/1998 | Tettinger | | H01R 9/0524 439/578 |
| 5,839,910 | A * | 11/1998 | Meller | | H01R 24/46 439/188 |
| 5,857,872 | A * | 1/1999 | Tettinger | | H01R 9/0524 439/584 |
| 5,984,723 | A * | 11/1999 | Wild | | H01R 9/0524 439/583 |
| 6,007,349 | A * | 12/1999 | Distefano | | H01L 23/49811 257/E23.021 |
| 6,053,755 | A * | 4/2000 | Oldfield | | H01R 24/542 439/289 |
| 6,132,244 | A * | 10/2000 | Leeman | | H01R 23/688 439/541.5 |
| 6,314,779 | B1 * | 11/2001 | Kesinger | | B21C 3/08 72/125 |
| 6,334,942 | B1 * | 1/2002 | Haba | | C25D 7/12 205/122 |
| 6,538,452 | B2 * | 3/2003 | Madsen | | G01R 31/045 324/538 |
| 6,705,884 | B1 * | 3/2004 | McCarthy | | H01R 4/5033 439/394 |
| 6,862,189 | B2 * | 3/2005 | Higuchi | | H01L 25/50 257/686 |
| 6,997,753 | B2 * | 2/2006 | Broomall | | H01R 9/0509 439/638 |
| 7,160,584 | B2 * | 1/2007 | Goeb | | F23Q 7/001 264/173.12 |
| 7,212,079 | B2 * | 5/2007 | Blavette | | H01P 1/266 333/22 R |
| 7,416,443 | B2 * | 8/2008 | Weiss | | G01R 27/32 439/578 |
| 7,448,907 | B2 * | 11/2008 | Lemke | | H01R 24/44 439/581 |
| 7,483,251 | B2 * | 1/2009 | Davis | | H01R 24/48 361/119 |
| 7,811,125 | B2 * | 10/2010 | Kretz | | H01R 24/40 439/578 |
| 8,197,287 | B2 * | 6/2012 | Rosenberger | | H01R 24/542 439/675 |
| 8,277,236 | B2 | 10/2012 | Weiss | | |
| 8,610,069 | B2 * | 12/2013 | Swank | | G01J 5/02 250/338.3 |
| 2002/0060904 | A1 * | 5/2002 | Higuchi | | H01L 25/50 361/760 |
| 2002/0076964 | A1 * | 6/2002 | Weisz-Margulescu | | H01R 13/424 439/263 |
| 2003/0082942 | A1 * | 5/2003 | Wlos | | H01R 13/6276 439/348 |
| 2003/0121146 | A1 * | 7/2003 | Schmidt | | H01L 23/49827 29/846 |
| 2003/0135998 | A1 * | 7/2003 | Walz | | G06K 19/07749 29/854 |
| 2004/0142596 | A1 * | 7/2004 | Henningsen | | H01R 9/0521 439/584 |
| 2005/0067159 | A1 * | 3/2005 | Hall | | E21B 17/003 166/65.1 |
| 2005/0159044 | A1 * | 7/2005 | Harwath | | H01R 24/564 439/578 |
| 2005/0212541 | A1 * | 9/2005 | Ruff | | G01R 1/06788 324/755.02 |
| 2005/0221529 | A1 * | 10/2005 | Bang | | B81C 1/0019 438/53 |
| 2005/0285706 | A1 * | 12/2005 | Hall | | E21B 17/028 336/132 |
| 2006/0038640 | A1 * | 2/2006 | D'Ostilio | | H01P 7/04 333/223 |
| 2006/0051983 | A1 * | 3/2006 | Heibler | | H02G 15/085 439/63 |
| 2006/0260797 | A1 * | 11/2006 | Hall | | E21B 17/028 166/65.1 |

(56) References Cited

U.S. PATENT DOCUMENTS

| | | | | |
|---|---|---|---|---|
| 2007/0190868 A1* | 8/2007 | De Cloet | H01R 13/631 | 439/851 |
| 2008/0119062 A1* | 5/2008 | Junemann | H01R 24/50 | 439/63 |
| 2008/0191706 A1* | 8/2008 | Burnett | G01N 27/20 | 324/533 |
| 2008/0231527 A1* | 9/2008 | Lemke | H01R 24/44 | 343/725 |
| 2009/0012515 A1* | 1/2009 | Hoenig | A61B 18/203 | 606/33 |
| 2009/0142960 A1* | 6/2009 | Yazawa | H01R 13/746 | 439/620.03 |
| 2009/0247009 A1* | 10/2009 | Yoshida | H01R 24/40 | 439/585 |
| 2010/0000982 A1* | 1/2010 | Allgaier | F23Q 7/001 | 219/270 |
| 2010/0007441 A1* | 1/2010 | Yagisawa | H01P 5/026 | 333/185 |
| 2010/0029130 A1* | 2/2010 | Kretz | H01R 24/40 | 439/578 |
| 2010/0029132 A1* | 2/2010 | Phillips, Jr. | H01R 13/187 | 439/584 |
| 2010/0120287 A1* | 5/2010 | Weiss | H01R 24/44 | 439/581 |
| 2010/0121318 A1* | 5/2010 | Hancock | A61B 18/18 | 606/33 |
| 2010/0178798 A1* | 7/2010 | Rosenberger | H01R 13/6315 | 439/578 |
| 2010/0295637 A1* | 11/2010 | Aead | H01P 1/225 | 333/81 A |
| 2011/0215080 A1* | 9/2011 | Hain | F23Q 7/001 | 219/270 |
| 2012/0126828 A1* | 5/2012 | Cohen | A61B 5/053 | 324/629 |
| 2012/0135260 A1* | 5/2012 | Jang | C25D 5/022 | 428/546 |
| 2013/0029525 A1* | 1/2013 | Bauerle | H01R 9/0518 | 439/607.41 |
| 2013/0029539 A1* | 1/2013 | Frank | H01R 4/183 | 439/750 |
| 2013/0035003 A1* | 2/2013 | Frank | H01R 13/14 | 439/750 |
| 2013/0127156 A1* | 5/2013 | Osswald | G01F 23/284 | 285/192 |
| 2014/0046316 A1* | 2/2014 | Ladtkow | A61B 6/487 | 606/33 |
| 2014/0134863 A1* | 5/2014 | Van Swearingen | H01F 10/00 | 439/217 |
| 2014/0273621 A1* | 9/2014 | Shaw | H01R 9/0524 | 439/578 |

FOREIGN PATENT DOCUMENTS

| | | |
|---|---|---|
| DE | 202004013305 U1 | 12/2004 |
| DE | WO2006021280 A1 | 3/2006 |
| DE | 202007004296 U1 | 8/2007 |
| EP | 0023437 A1 | 2/1981 |

* cited by examiner

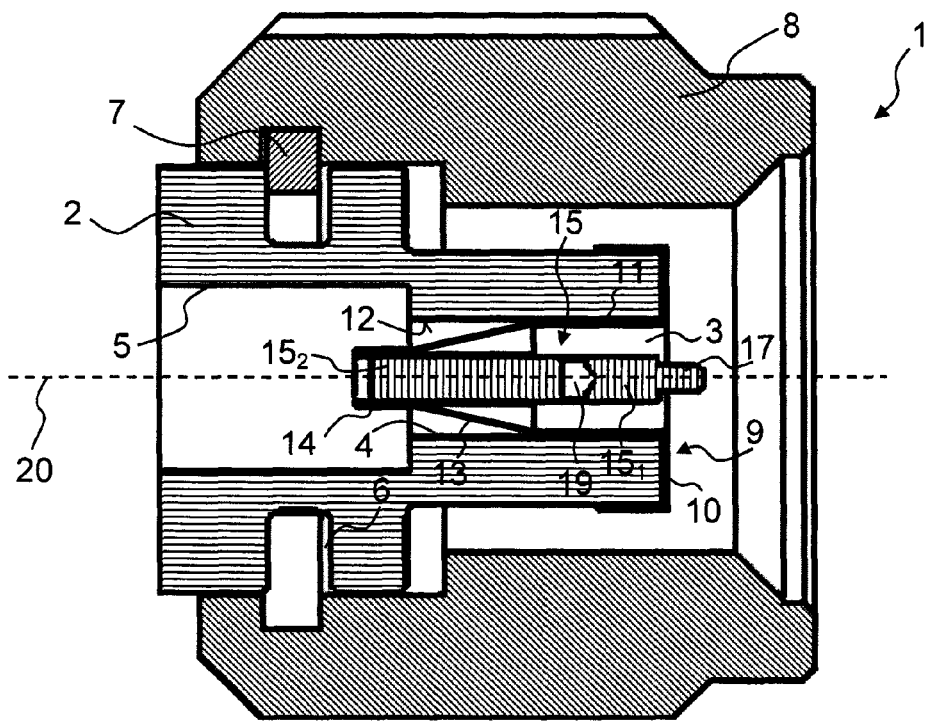
Fig. 1
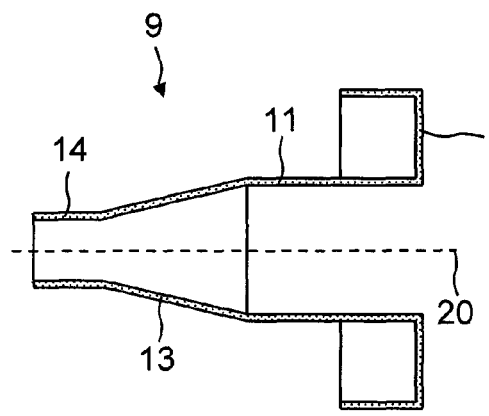 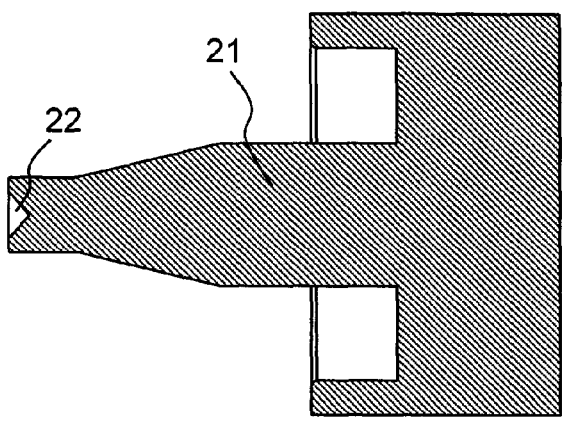
Fig. 2A      Fig. 2B

CALIBRATION UNIT FOR A MEASUREMENT DEVICE

CROSS-REFERENCE TO RELATED APPLICATION(S)

The present application is a national phase application of PCT application No. PCT/EP2011/064121, filed on Aug. 17, 2011, and claims priority to German Application No. DE 102010045780.9, filed on Sep. 17, 2010, the entire contents of which are incorporated herein by reference.

FIELD OF THE INVENTION

The invention relates to a calibration unit for an electronic measurement device, especially a network analyzer.

BACKGROUND OF THE INVENTION

Network analyzers which are used for determining scattering parameters of connected devices under test, such as filters, amplifiers and attenuation elements, cover a broad frequency range and are achieving increasingly upper frequency limits. The scattering parameters of devices under test can be determined, for example, in the W band (75 GHz to 110 GHz), via special upconverter units. In this context, the individual components of a network analyzer themselves are affected by error and provide a frequency response and a phase response, which, especially in the case of high frequencies, prevents accurate measurement of the device under test. Calibrating the network analyzer provides a compensation of these system errors, thereby significantly increasing the measurement accuracy.

Such a calibration is achieved by connecting different calibration standards with known electrical properties to the test ports consecutively and determining the measured values. Known calibration standards are "open" (English: open), "short" (English: short), "match" (English: match) and "through" (English: through). In this context, for example, the calibration standard "match" must achieve the maximum possible signal attenuation over the broadest possible frequency range, so that a clear differentiation is guaranteed, for example, between the calibration standard "match" and the calibration standard "short". The calibration standards "open", "short" and "match" are provided in this context as coaxial connectors, which are screwed to the individual coaxial test ports of the network analyzer. To transmit signals with frequencies up to 110 GHz via a coaxial connection, coaxial lines, of which the outer conductor diameter is 1 mm and the inner conductor diameter is 0.434 mm, are used. The calibration standards embodied as coaxial connectors must accordingly be manufactured in a very precise and at the same time mechanically robust manner because even deviations of 0.005 mm in the outer conductor diameter cause the wave impedance to vary by approximately 0.7 ohms, thereby preventing high-precision measurements.

A termination for a coaxial line system is known from U.S. Pat. No. 5,047,737 A. An inner conductor provides a groove, which is used to host a substrate. The substrate is coated with a thin-film resistor, which is connected to the inner conductor by means of a soldered connection. The thin-film resistor connects the inner conductor to the housing. In this context, the borehole within the housing is tapered towards the end. The disadvantage with U.S. Pat. No. 5,047,737 A is that the junction from the inner conductor to the substrate represents a considerable disturbance of the electromagnetic field and therefore reduces the efficiency of the attenuation element.

Accordingly, there is a need to provide a calibration unit which is, on one hand, mechanically robust, and, on the other hand, also achieves optimal properties at very high frequencies, and to provide a corresponding manufacturing method.

SUMMARY OF THE INVENTION

Embodiments of the invention, therefore, advantageously provide for a mechanically robust calibration unit that achieves optimal properties at very high frequencies.

According to an exemplary embodiment, a calibration unit, for a measurement device for connecting to a connector embodied in a coaxial manner, comprises a housing and an inner conductor, wherein the inner conductor is centered within an aperture of the housing. The calibration unit further comprises a connecting element, wherein the connecting element is inserted into the aperture of the housing and hosts the inner conductor, and wherein the connecting element is embodied in an elastic manner and supports the inner conductor relative to the housing.

With regard to the feature whereby an elastic connecting element can be inserted into the aperture of the housing of the calibration unit and would thereby host the inner conductor, certain advantages are achieved. For example, this allows the inner conductor to be particularly well centered and always to provide the same distance from the outer conductor, so that the wave impedance of the calibration circuit hardly varies over the frequency range. The elastic embodiment of the connecting element ensures that the mechanical integrity of the calibration unit is not impaired by repeatedly screwing to the measurement unit to be calibrated, even if the calibration unit is not mounted on a carriage and moved only in the horizontal axis towards the measuring unit to be calibrated. The elastic connecting element also attenuates relatively small vibrations, caused, for example, by accidental dropping of the calibration unit.

According to a further exemplary embodiment, in a first method step of a method for manufacturing a calibration unit, a forming template which provides a negative shape of a connecting element, is electroplated, thereby producing the connecting element. In a second method step, the electroplated connecting element is separated from the forming template by etching away the forming template or by peeling the connecting element off the forming template.

With regard to the aspect of the method for manufacturing the calibration unit whereby the elastic connecting element is manufactured by a electroplating process, certain advantages are achieved. For example, the layer thickness and therefore also the spring constant can accordingly be adjusted very precisely to the requirements. Furthermore, it is advantageous that the forming template is separated from the connecting element by etching, because, as a result, the structure of the connecting element is preserved.

A further advantage of the calibration unit according to embodiments of the invention is achieved if the connecting element is embodied in a funnel shape and comprises several contiguous individual segments. The funnel-shaped embodiment with a segment varying in diameter ensures that the calibration unit provides optimal properties over a very broad frequency range. The various individual segments of the connecting element are embodied differently and are used, for example, to attach the connecting element to the housing or to allow the connecting element to host the inner conductor.

Moreover, an advantage of the calibration unit according to embodiments of the invention is achieved if a first individual segment of the connecting element is embodied as a flange or a cowl and glued and/or pressed and/or soldered to the housing in an electrically conductive manner. A first individual segment of the connecting element embodied as a flange or a cowl which is placed over the aperture of the housing ensures that the connecting element does not cant in the aperture of the housing, but can always be fitted with optimal alignment. The fact that the connecting element is glued and/or pressed and/or soldered to the housing ensures that the connecting element not becomes unfastened also during the course of time, and accordingly, the inner conductor hosted by the connecting element is permanently fixed in its position.

Finally, an advantage is achieved with the calibration unit according to embodiments of the invention if the inner conductor comprises at least two individual segments in the case of the load states "open" and "match", wherein a second individual segment is made from a dielectric, which, in the case of the load state "match" is partially coated with a thin-film resistor or a thick-film resistor and an electrically conductive material. This allows that, on the one hand, the calibration unit covers the calibration standards "short" and "open", and, on the other hand, by means of the thin-film resistor or thick-film resistor, it can also be used for the calibration standard "match". The thin-film resistor or the thick-film resistor is usually selected in such a manner that the calibration unit achieves a resistance of 50 ohms over the broadest possible frequency range up to 110 GHz as accurately as possible.

In the case of the method according to the invention for manufacturing the calibration unit, a further advantage is achieved, in accordance with a further exemplary embodiment wherein the inner conductor or a first segment of the inner conductor is manufactured in a lathing process and electroplated and/or sputtered with a material providing very good conductivity. On the basis of these further method steps, the inner conductor can be manufactured very precisely, so that the wave impedance does not vary. Lathing processes allow an accuracy of a few micrometers.

Furthermore, with regard to the method for manufacturing the calibration unit, an advantage is achieved according to a further exemplary embodiment, wherein a second segment of the inner conductor with dielectric properties is manufactured by a pressing process and/or a sintering process and/or a lathing process, and if a thin-film resistor or thick-film resistor and an electrically conductive layer are applied sectionally to the second segment and if the thin-film resistor or the thick-film resistor afterwards is trimmed by means of a laser, and if the second segment of the inner conductor is connected to a first segment of the inner conductor by means of a soldering process and/or a gluing process. This allows the manufacturing of a calibration unit for the calibration standard "match", wherein the thin-film resistor is selected in such a manner that the calibration unit provides, as accurately as possible, a resistance of, for example, 50 ohms.

Finally, with regard to the method for manufacturing the calibration unit, in accordance with a further exemplary embodiment, an advantage is achieved wherein the inner conductor, or the first individual segment and the second individual segment of the inner conductor, is pushed into the connecting element in such a manner that the connecting element can then be inserted into the aperture of the housing and soldered or glued to the housing. Such an embodiment of the connecting element allows a very simple assembly, whereas the connecting element can also be used for calibration units, which cover the calibration standards "open" and "short". In the case of the calibration standard "open", the second segment of the inner conductor is not coated with a thin-film resistor, and in the case of the calibration standard "short", the second segment of the inner conductor is made of metal or is coated with a metallic layer.

BRIEF DESCRIPTION OF THE DRAWINGS

Various exemplary embodiments of the invention are described by way of example below with reference to the drawings. Identical subject matters show the same reference numbers. The corresponding figures of the drawings show:

FIG. 1 illustrates a section along a longitudinal axis of the calibration unit, according to exemplary embodiments of the invention;

FIG. 2A illustrates a section along the longitudinal axis of the connecting element, according to exemplary embodiments of the invention;

FIG. 2B illustrates a section along the longitudinal axis through a forming template of the connecting element, according to exemplary embodiments of the invention;

DETAILED DESCRIPTION OF EXEMPLARY EMBODIMENTS OF THE INVENTION

Figure 3:
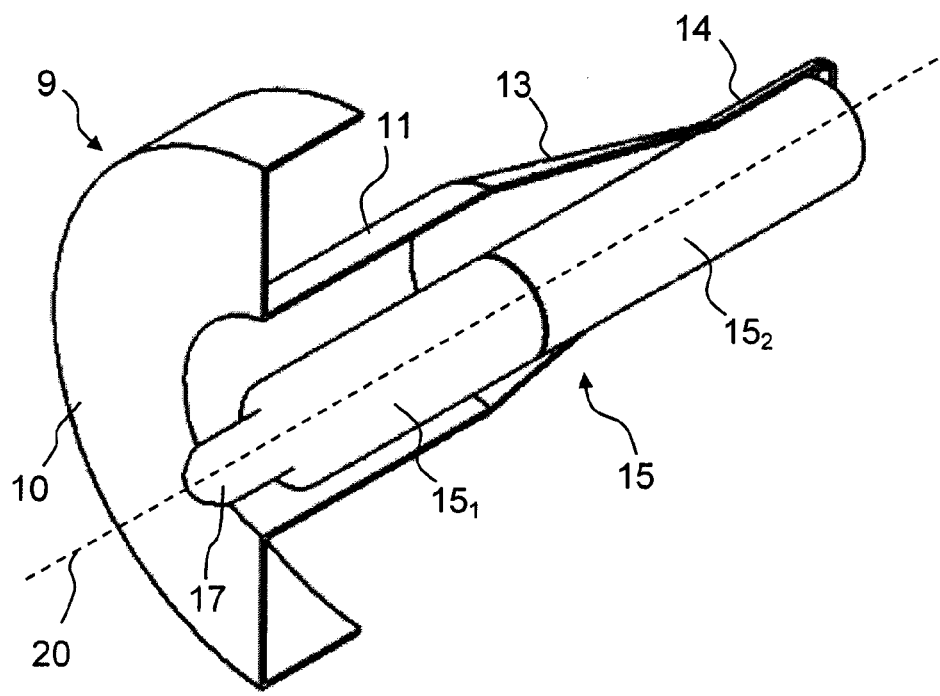
FIG. 3 illustrates a perspective view of a section along the longitudinal axis of the connecting element, according to exemplary embodiments of the invention.

FIG. 1 shows a section along a longitudinal axis 20 through an exemplary embodiment of the calibration unit 1 according to the invention. The calibration unit is connected to a measurement device, which is preferably a network analyzer. In this context, the calibration unit 1 is embodied as a coaxial connector and, with a frequency range up to 110 GHz, can host an outer conductor with an outer-conductor diameter of 1 mm. The calibration unit 1 comprises a housing 2, which is electrically conductive or at least is coated with a layer of good electrical conductivity. By preference, the housing 2 is coated with a gold layer in a electroplating process. Dependent on the shape of the housing, the housing 2 can also be coated with a conductive layer in a sputtering process. The housing 2 in the exemplary embodiment according to the invention from FIG. 1 is embodied as a hollow cylinder and provides an aperture 3. This aperture 3 is preferably formed by a drilling process, whereas a first drilling radius 4 at the hosting end of the housing 2 is preferably selected to be smaller than a second drilling radius 5 at the second end of the housing 2 facing opposite to the hosting end. The outer diameter of the housing 2 at the hosting end is also smaller than at the second end of the housing 2.

A groove 6, which can be manufactured by a lathing process, is embodied at the second end of the housing 2. A snap ring 7, over which a union nut 8 is attached, is inserted into the groove 6, in such a manner that the union nut 8 is held in a movable manner at the housing 2. The union nut 8 provides a thread at the connecting end of the housing 2, with the assistance of which the calibration unit 1 can be rigidly screw connected to a connecting port of the network analyzer. Furthermore, the calibration unit 1 provides a connecting element 9, whereas the connecting element 9 can preferably be inserted into the aperture 3 at the connecting end of the housing 2. The connecting element 9 is preferably embodied in a funnel shape and comprises several contiguous individual segments. A first individual segment 10 of the connecting element 9 is embodied as a flange or a cowl and glued and/or pressed and/or soldered to the connecting end of the housing 2. The fact that a radius of the first individual segment 10 of the connecting element 9 is larger than the radius 4 of the first borehole ensures that the connecting element 9 does not fall through the aperture 3 of the housing 2 during assembly. A cowl shape of the first individual segment 10 of the connecting element 9, which encompasses partially the housing 2, ensures that the connecting element 9 is partially fixed in the axial direction until it is glued and/or pressed and/or soldered and automatically centers itself.

A second individual segment 11 of the connecting element 9 provides an inner diameter, which corresponds with the inner diameter of the outer conductor of the connector to be connected plus twice the wall thickness of the connecting element 9, whereas the radius 4 of the first borehole is preferably selected in such a manner that the second individual segment 11 lies flat in a form-fit manner against the internal surface 12 of the housing 2.

A third individual segment 13 of the connecting element 9 is embodied in a narrowing manner, for example conical, so that the connecting element 9 tapers in its diameter. The tapering shape of the third individual segment 13 of the connecting element 9 means that, on the one hand, the connecting element 9 provides elastic properties and, on the other hand, allows an optimum matching up to frequencies of 110 GHz and above. Dependent upon the shape of the housing 2, other mathematically-based shapes for the third individual segment 13 are conceivable under some circumstances, if they have a favorable influence on the reflection behavior.

A fourth individual segment 14 of the connecting element 9 is used as a hosting element for an inner conductor 15. The diameter of this fourth individual segment 14 is selected in such a manner that the inner conductor 15 can be inserted into it. The connecting element 9 is made from a material with very good conductivity, preferably gold. The process for manufacturing the connecting element 9 will be described in greater detail below.

The inner conductor 15 is embodied to be centered via the connecting element 9 within the aperture 3 of the housing 2. The inner conductor 15 of the calibration unit 1 can be embodied in one piece or in several parts dependent on whether the calibration unit 1 represents the calibration standards "open" or "short" or "match".

If the calibration unit 1 is to fulfill the calibration standard "short", the inner conductor 15 is preferably embodied in one piece from a metal, whereas the surface of the inner conductor 15 is preferably coated with a material of very good conductivity, preferably gold.

FIG. 1 shows a two-part embodiment of the inner conductor 15 as it can be constructed for the calibration standards "open" and "match". The inner conductor 15 is built up from two individual segments. A first individual segment $15_1$ of the inner conductor 15 is embodied either as a contact plug 17 or as a contact socket 43 and contacts a connecting port of the network analyzer to be calibrated directly or indirectly via a coaxial connecting cable. It is evident that, in the exemplary embodiment from FIG. 1, the first individual segment $15_1$ of the inner conductor 15 is embodied as a contact plug 17. In this context, the contact plug 17 of the first individual segment $15_1$ of the inner conductor 15 provides a smaller diameter than the inner conductor 15 itself. At the end facing away from the contact plug 17, the first individual segment $15_1$ of the inner conductor 15 provides a borehole 19, into which the second individual segment $15_2$ of the inner conductor 15 is inserted. The second individual segment $15_2$ of the inner conductor 15 is glued and/or soldered in an electrically conductive manner to the first individual segment $15_1$ of the inner conductor 15. If the connector of the calibration unit 1 is a 1-mm coaxial connector which is suitable for frequencies up to 110 GHz, the diameter of the inner conductor 15 is 0.434 mm.

The second individual segment $15_2$ is made of a dielectric with the lowest possible dielectric conductivity $\in_r$ and a high resistance to bending, so that the inner conductor 15 can also withstand mechanical stresses. By contrast with aluminum oxide, zirconium oxide in fact provides a relatively high resistance to bending, however, the permittivity $\in_r$ is extremely high. Silicon nitride ($Si_3N_4$) offers a good compromise, which, when sintered or preferably HIP-processed (hot isostatic pressing) provides a very high resistance to bending at the same time as a low permittivity $\in_r$.

If the calibration unit 1 forms the calibration standard "match", the second individual segment $15_2$ of the inner conductor 15, which acts as an absorber, is coated with a thin-film resistor or a thick-film resistor. For example, a nickel-chromium alloy is suitable as the material for the thin-film resistor. In this context, the second individual segment $15_2$ of the inner conductor 15 is completely or partially coated with the thin-film resistor or a thick-film resistor. At a contact position between the fourth individual segment 14 of the connecting element 9 and the second individual segment $15_2$ of the inner conductor 15, the second individual segment $15_2$ of the inner conductor 15 is preferably coated with a material of very good electrical conductivity, as for example gold.

If the calibration unit 1 forms the calibration standard "open", the coating of the second individual segment $15_2$ of the inner conductor 15 with the thin-film resistor or the thick-film resistor can be completely omitted. The second individual segment $15_2$ of the inner conductor 15 is glued and/or soldered and/or clamped to the connecting element 9 or respectively to the fourth individual segment 14 of the connecting element 9.

The inner conductor 15 is pushed into the aperture 3 of the connecting element 9 until only the contact plug 17 projects from the aperture 3 of the connecting element 9. Instead of a contact plug 17, the inner conductor can also be embodied at its end not connected to the connecting element 9 as a contact socket 43, whereas, in this case, the contact socket 43 lines up precisely with the aperture of the connecting element 9. In this context, the connecting element 9 is made from an electrically conductive material and connects the inner conductor 15 to the housing 2 in an electrically conductive manner.

FIG. 2A shows a section along the longitudinal axis 20 through an exemplary embodiment of the connecting element 9 according to the invention. The four individual segments 10, 11, 13, 14, which are connected seamlessly to one another and form the connecting element 9, are clearly identifiable. As already explained, the third segment 13 allows the inner conductor 15 hosted by the connecting element 9 to be supported in an elastic manner relative to the housing. This ensures that the inner conductor 15 is always aligned centered within the aperture 3 of the housing 2, even after the calibration unit 1 has been screwed to and unscrewed from a connecting port of the network analyzer or a coaxial connecting line of the network analyzer several times, so that the desired properties of the calibration unit 1 are reliably preserved even for high frequencies. This also applies if the calibration unit 1 is accidentally dropped on the floor.

FIG. 2B shows a section along the longitudinal axis 20 through a forming template 21 of an exemplary embodiment of the connecting element 9 according to the invention. The connecting element 9, which, on the one hand ensures the optimal matching and, on the other hand, gives the calibration unit 1 an adequate mechanical stability, must be manufactured very accurately to ensure that the calibration unit 1 depicts the various calibration standards for frequencies up to 110 GHz in an optimal manner. For this purpose, the forming template 21 is preferably lathed from aluminum. This forming template 21 is identifiable in FIG. 2B. Following this, the forming template 21 is coated in a electroplating process with a material of very good electrical conductivity, such as gold. The wall thickness of the connecting element 9 in this context can be adjusted arbitrarily with very high precision within the range of a few tens of micrometers. The wall thickness of the connecting element 9 in this context is selected in such a manner that the inner conductor 15 of the calibration unit 1 can be displaced on the small scale in an elastic manner, and accordingly, a fracture of the inner conductor 15 or of the second individual segment $15_2$ of the inner conductor 15 is avoided.

As soon as the correct wall thickness has been achieved, the connecting element 9 can be pelt of from the forming template 21. However, the forming template 21, which is made, for example, of aluminum, is preferably etched away, so that only the connecting element 9 remains. This can be achieved, for example, through the use of sodium hydroxide solution. This ensures that the required shape of the connecting element 9 is preserved. The preferred, conical shape of the third individual segment 13 allows a calibration unit 1 which forms the calibration standard "match" to achieve optimal attenuation behavior over a broad frequency range. The indentation 22 at the end of the forming template 21 ensures that an inwardly extending cone is provided in the fourth individual segment 14 of the connecting element. This serves as a centering aid for a borehole thereby speeding up the posterior etching process after the electroplating step.

FIG. 3 shows a section along the longitudinal axis 20 of an exemplary embodiment of the connecting element 9 according to the invention in a perspective view. The first individual segment 10 of the connecting element 9 in this context provides a cowl shape, as shown in FIG. 1. However, a planar flange-shaped embodiment is also possible. The other individual segments 11, 13, 14 are also shown, whereas the inner conductor 15 is glued and/or soldered and/or clamped to the fourth individual segment 14.

Figure 4A:
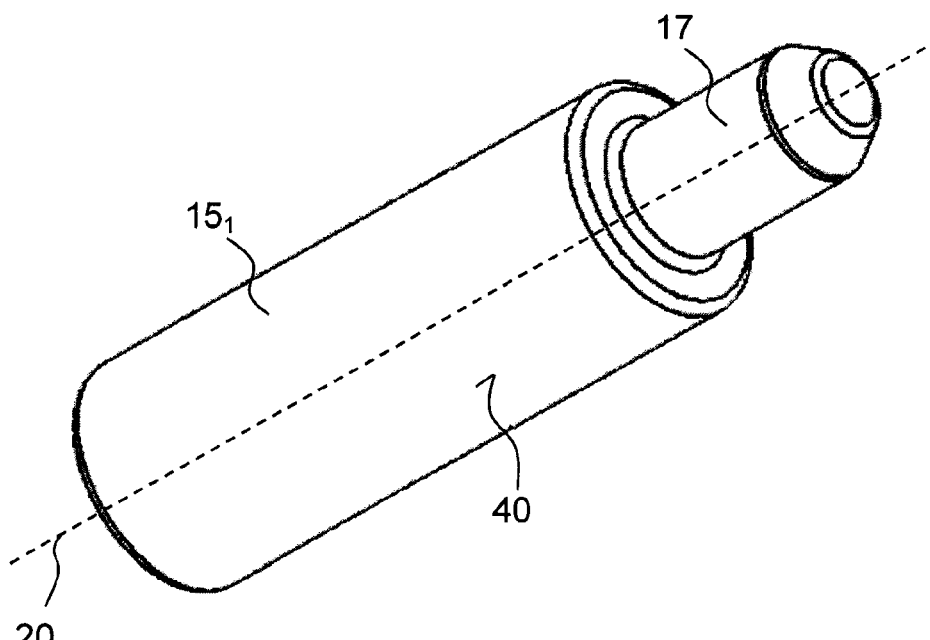
FIG. 4A illustrates a perspective view of an inner conductor with a contact plug, according to exemplary embodiments of the invention.

FIG. 4A shows a perspective view of an exemplary embodiment of the inner conductor 15 according to the invention with its contact plug 17. The inner conductor 15 can also be only the first segment $15_1$ of the inner conductor 15 from FIG. 1. The inner conductor 15 and its contact plug 17 are manufactured in a lathing process and then coated by sputtering or electroplating with a layer of a material of very good electrical conductivity. This sputtering or electroplating process is adjusted in such a manner that the required diameter for the inner conductor 15 is obtained.

Figure 4B:
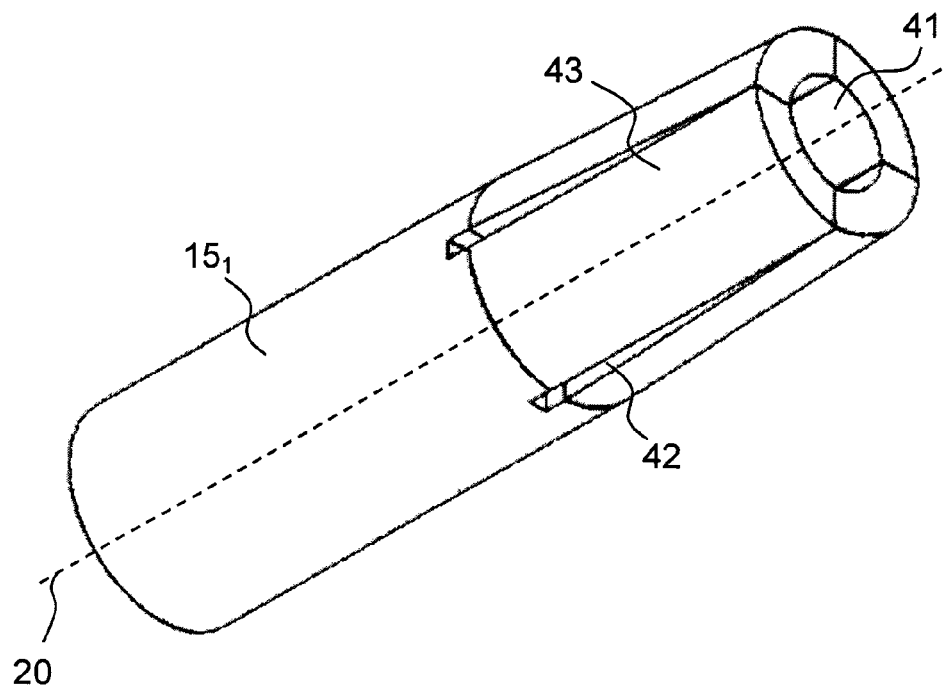
FIG. 4B illustrates a perspective view of an inner conductor with the contact socket, according to exemplary embodiments of the invention.

FIG. 4B shows a perspective view of an exemplary embodiment of an inner conductor 15 according to the invention with the contact socket 43, which can also be only the first segment $15_1$ of the inner conductor 15 from FIG. 1, and which is also manufactured in a lathing process. Following this, in a drilling process, a borehole 41 is drilled into the inner conductor 15 and at least one longitudinal slot 42 is milled into the contact socket 43 in a subsequent milling process. Finally, the contact socket 43 is pressed together, as shown in FIG. 4B, to form a conical shape, so that, upon contact with a plug contact as shown in FIG. 4A, the contact socket 43 widens in such a manner that the inner conductor 15 provides a diameter of 0.434 mm. The slotted inner conductor 15, equipped with the contact socket 43 and somewhat reduced in its diameter, as well as the inner conductor 15 with a plug contact, is coated in a sputtering or electroplating process, with a layer of a material of very good electrical conductivity, whereas the process is adjusted in such a manner that the required diameter of the inner conductor 15 is obtained.

Figure 5A:
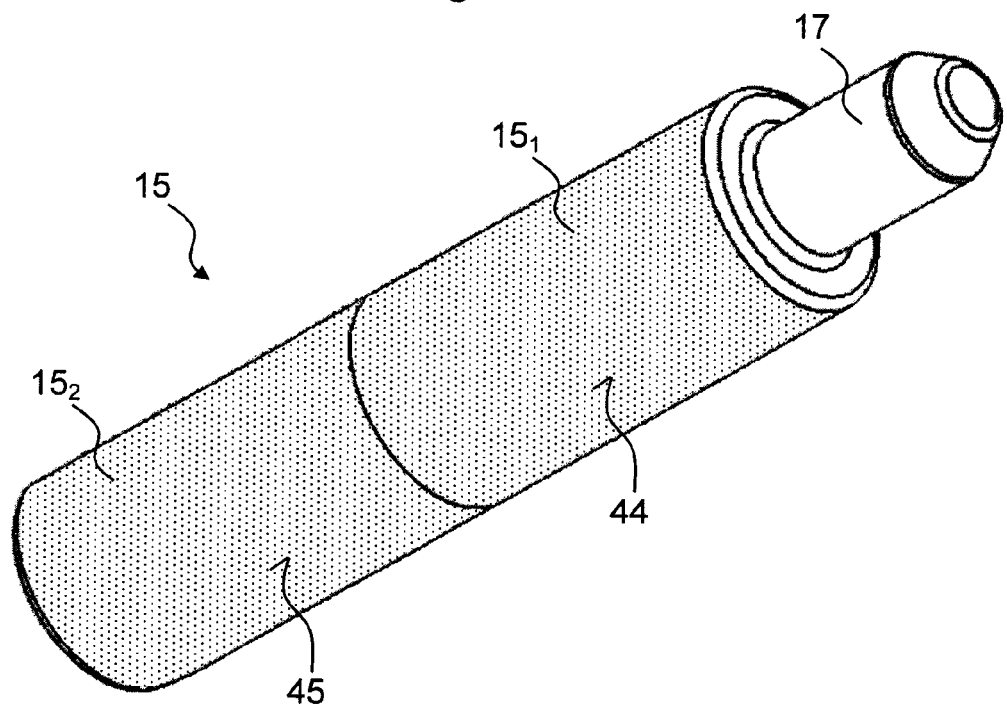
FIG. 5A illustrates a perspective view of an inner conductor, for example, as it can be used for the calibration standard "short," according to exemplary embodiments of the invention.

FIG. 5A shows a perspective view of an exemplary embodiment of an inner conductor 15 according to the invention, as can be used for the calibration standard "short". The inner conductor 15 in this exemplary embodiment comprises a first individual segment $15_1$ and a second individual segment $15_2$, of which the surfaces 44 and 45 are each coated with a layer of a material of very good electrical conductivity. By preference the inner conductor 15 for the calibration standard "short" is embodied in one piece, so that absolutely no imperfection can be formed between the first individual segment $15_1$ and the second individual segment $15_2$.

Figure 5B:
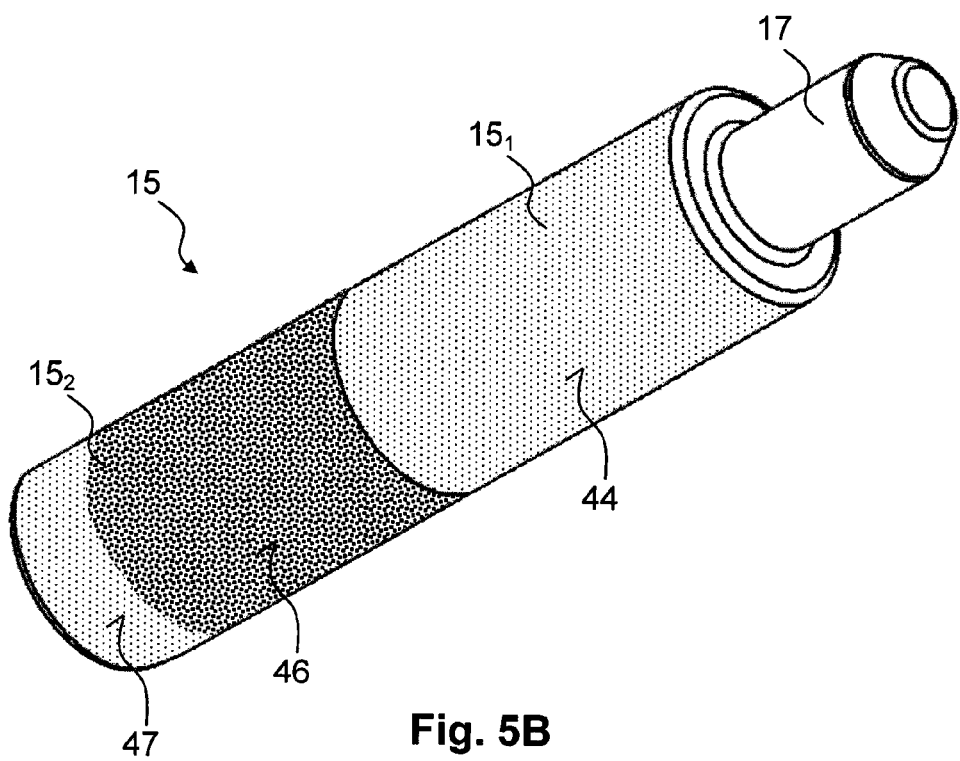
FIG. 5B illustrates a perspective view of an inner conductor, for example, as it can be used for the calibration standard "match," according to exemplary embodiments of the invention.

FIG. 5B shows a perspective view of an exemplary embodiment of the inner conductor 15 according to the invention, as can be used for the calibration standard "match". The inner conductor 15 in this context is embodied in two parts and provides a first individual segment $15_1$ and a second individual segment $15_2$. In this context, at least the surface 44 of the first individual segment $15_1$ is coated with a material of very good electrical conductivity, preferably gold. The second individual segment $15_2$, which is made from a dielectric, is provided, preferably on its surface 47, which is connected in an electrically conductive manner to the fourth individual segment 14 of the connecting element 9, with an electrically conductive layer, for example, made of gold. In this context, the surface 47 occupies only a part of the surface of the second individual segment $15_2$ of the inner conductor 15. The remaining surface 46 of the second individual segment $15_2$ of the inner conductor 15 is coated with a thin-film resistor or a thick-film resistor, of which the thickness is selected in such a manner that the inner conductor 15 with its first individual segment $15_1$ and its second individual segment $15_2$ and with the connecting element 9 and the housing 2 achieves a resistance value, for example, somewhat below 50 ohms. The required resistance value, for example, of exactly 50 ohms, is adjusted on the basis of a trimming process using a laser.

Figure 5C:
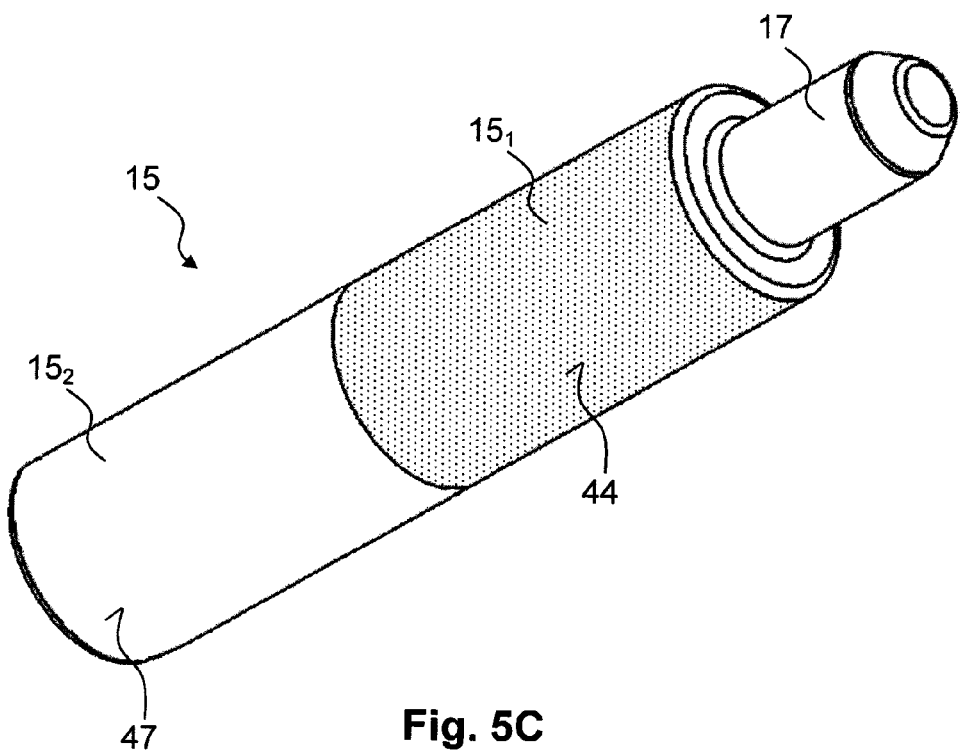
FIG. 5C illustrates a perspective view of an inner conductor, for example, as it can be used for the calibration standard "open," according to exemplary embodiments of the invention.

FIG. 5C shows a perspective view of an exemplary embodiment of an inner conductor 15 according to the invention, as can be used for the calibration standard "open". In this context the inner conductor 15 is embodied with its first individual segment $15_1$ and its second individual segment $15_2$ in two parts. The first individual segment $15_1$ of the inner conductor 15 is coated at least on its surface 44 with an electrically conductive layer. The second individual segment $15_2$ on its surface, which is mechanically connected directly to the fourth individual segment 14 of the connecting element 9, is preferably not coated with a layer or is coated with an electrically non-conductive layer.

Figure 6:
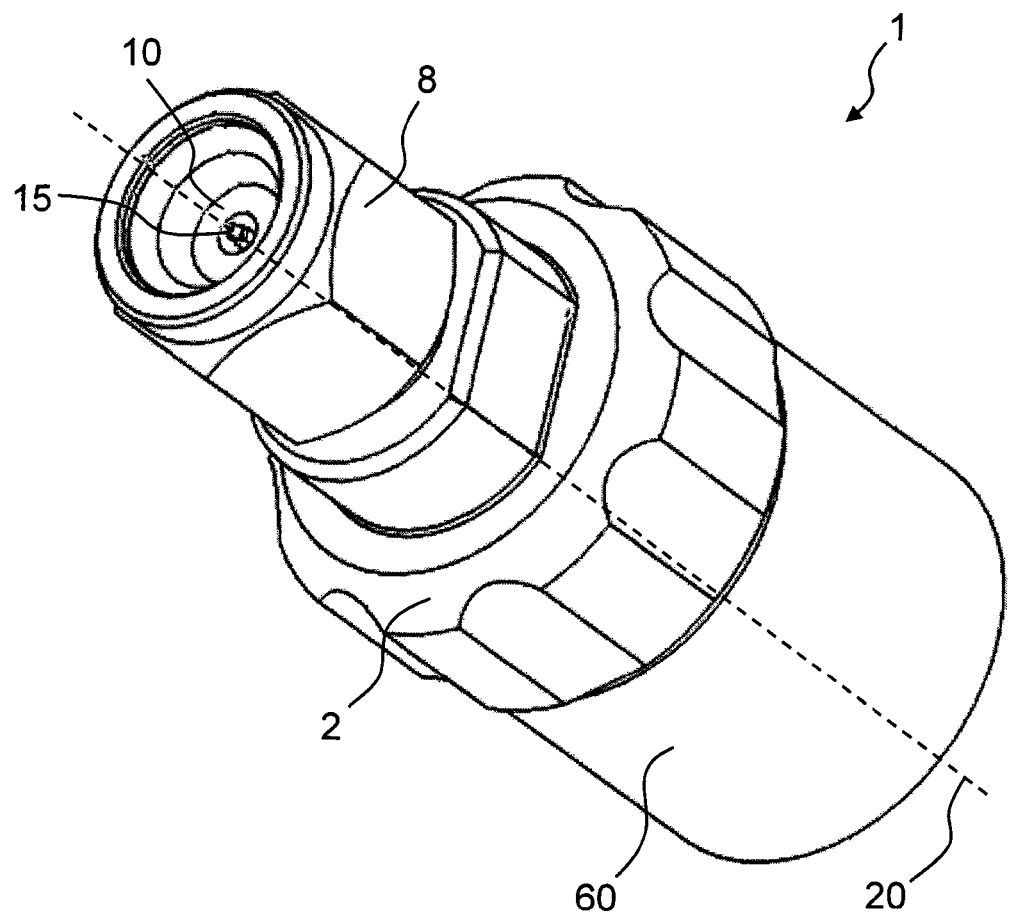
FIG. 6 illustrates a perspective view of the calibration unit in the assembled state, according to exemplary embodiments of the invention.

FIG. 6 shows a perspective view of an exemplary embodiment of the complete calibration unit 1 according to the invention as a mal connector in the assembled state. The housing 2 with the union nut 8 is evident. Furthermore, a thread is embodied in the union nut 8, by which the calibration unit 1 is screw-connected to the connecting port of the network analyzer to be calibrated. The first segment 10 of the connecting element 9 is also shown. The inner conductor 15 provided with a contact plug 17 is embodied between them. A housing cap 60 is attached to the end of the housing 2 facing away from the plug connection. In principle, the exemplary embodiment of the complete calibration unit 1 according to the invention as shown in FIG. 6 can also be embodied as a female connector. For this purpose, the inner conductor 15 is provided with a contact socket 43. Furthermore, the union nut 8 is omitted, and the housing 2 is provided with an additional thread.

Figure 7:
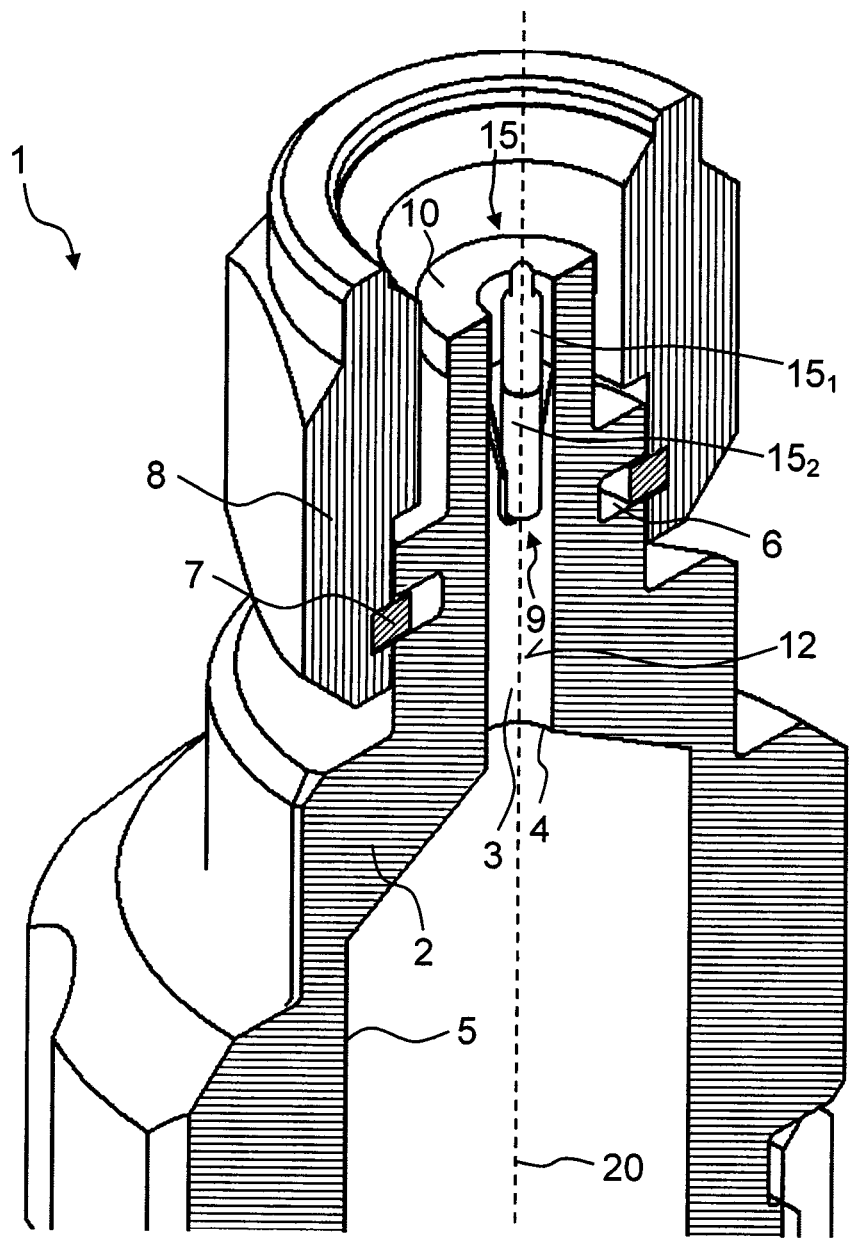
FIG. 7 illustrates a section of a perspective view of the calibration unit along the longitudinal axis, according to exemplary embodiments of the invention.

FIG. 7 shows a sectional perspective view of an exemplary embodiment of the calibration unit 1 according to the invention along the longitudinal axis 20. To allow a better overview, the section of the inner conductor 15 has not been illustrated with hatching. The union nut 8 with its thread, the snap ring 7, the groove 6 and the housing 2 are all shown. The different borehole radii 4 and 5 in the housing 2 are easily recognizable. The inner conductor 15 formed in two-parts is embodied centered within the aperture 3 of the housing 2 and clamped and/or soldered and/or glued rigidly to the connecting element 9. The connecting element 9 is rigidly glued and/or soldered to the housing with its first segment 10 embodied in a cowl shape.

Figure 8:
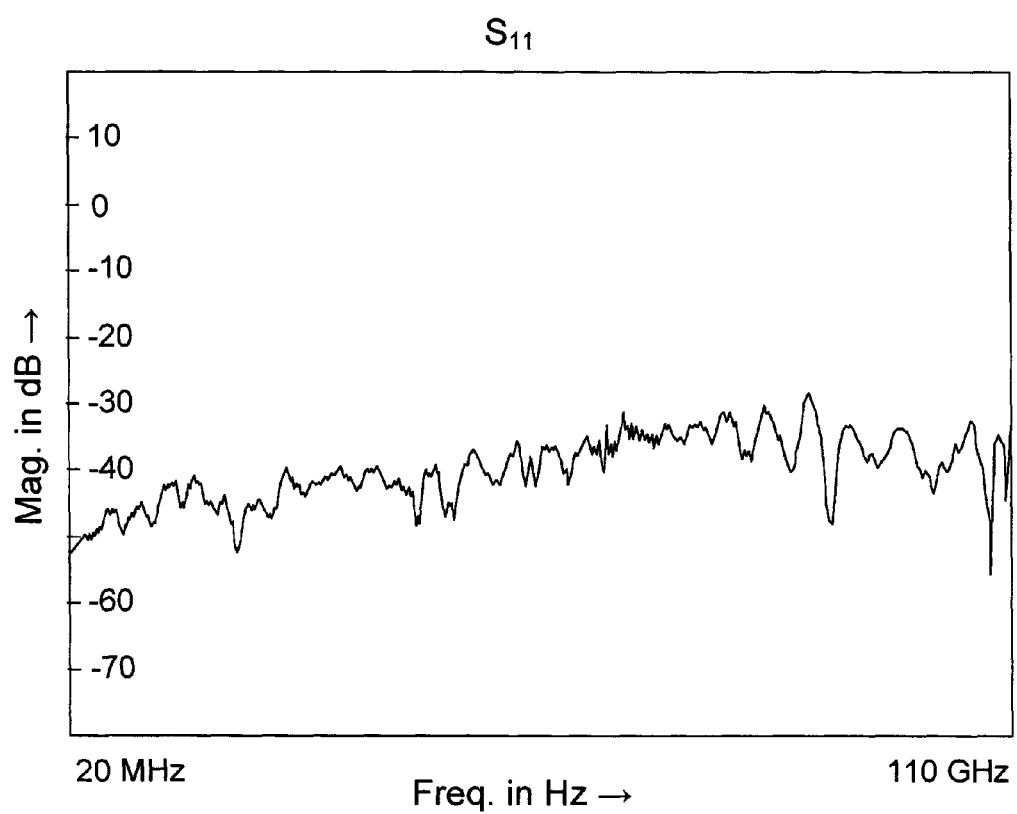
FIG. 8 illustrates the S11 parameter plotted versus the frequency for calibration unit, according to exemplary embodiments of the invention.

FIG. 8 shows the magnitude of the scattering parameter S11 in a logarithmic display, that is to say, the reflection attenuation versus the frequency for an exemplary embodiment of the calibration units 1 according to the invention. The calibration unit 1 in this exemplary embodiment represents the calibration standard "match". It is evident that the reflection attenuation within the frequency range from 20 MHz to 110 GHz attains a maximal value of, for example, −30 dB. The frequency is plotted on the abscissa in a linear manner from 20 MHz to 110 GHz. For the calibration standard "match", this is a very good value, which guarantees a more secure differentiation, that is, a large dynamic range, between the calibration standard "match" and the calibration standards "open" and "short".

Figure 9:
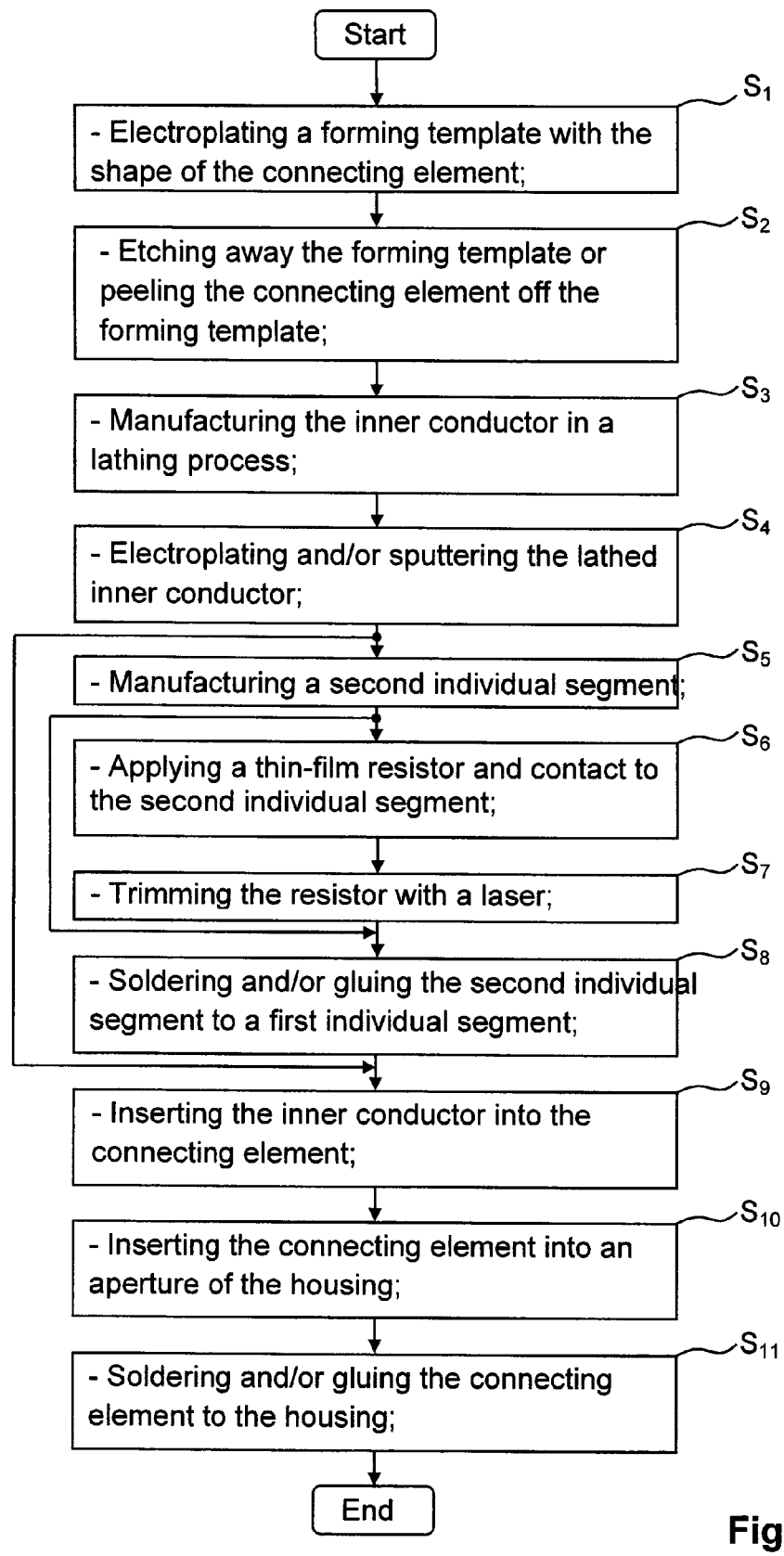
FIG. 9 illustrates a flow chart for manufacturing the calibration unit, according to exemplary embodiments of the invention.

FIG. 9 shows a flow chart of the method for the manufacture of the calibration unit 1 according to the invention for the exemplary embodiment of a "match". For the exemplary embodiments "short" or respectively "open", the method steps $S_5$ to $S_8$ or respectively $S_6$ to $S_7$ are preferably omitted. In a first method step $S_1$, a pre-fabricated forming template 21 comprising a base material, preferably made of aluminum, is electroplated in a electroplating method, preferably with a gold layer of adjustable wall thickness. The forming template 21 also represents a negative shape of the connecting element 9. Before the electroplating process, a thin-film, which preferably comprises gold, can be applied to the forming template 21 by sputtering.

In a second method step $S_2$, the forming template 21 is etched away or the connecting element 9 obtained from the electroplating process is peeled off the forming template 21.

In a third method step $S_3$, the inner conductor 15 or only a first individual segment $15_1$ is manufactured in a lathing process, as far as possible from a hard metal.

In a fourth method step $S_4$, a covering layer of very good conductivity is applied to the inner conductor 15 or only to a first individual segment $15_1$ by electroplating and/or sputtering. By preference, the conductive covering layer is a gold layer.

If the calibration unit 1 is to form the calibration standard "open" or "match", a second individual segment $15_2$ of the inner conductor 15 is preferably manufactured in a fifth method step $S_6$, from a dielectric, such as sintered or HIP-processed silicon nitride ($Si_3N_4$).

If the calibration unit 1 is to form the calibration standard "match", a thin-film resistor or a thick-film resistor is applied to the second individual segment $15_2$ of the inner conductor 15 in a sixth method step $S_6$. At a contact point between the fourth individual segment 14 of the connecting element 9 and the second individual segment $15_2$ of the inner conductor 15 the second individual segment $15_2$ of the inner conductor 15 is preferably coated with a material of very good electrical conductivity, such as gold, If the calibration unit 1 is to form the calibration standard "match", the thin-film resistor or the thick-film resistor of the individual segment $15_2$ is trimmed in a seventh method step $S_7$, using a laser to the required value of, for example, exactly 50 ohms.

If the calibration unit 1 is to form the calibration standard "open" or "match", the second individual segment $15_2$ of the inner conductor 15 is soldered and/or glued in an electrically conductive manner to a first individual segment $15_1$ of the inner conductor 15 in an eighth method step $S_8$.

In a ninth method step $S_9$, both the inner conductor 15 embodied in one piece, and also the inner conductor 15 embodied in more than one piece with its first segment $15_1$ and its second segment $15_2$ is pushed into the connecting element 9 in such a manner that the inner conductor 15 is arranged centered in the connecting element 9 and soldered and/or glued and/or clamped rigidly with its end facing away from the connecting plug to the connecting element 9. In this context, the inner conductor 15 is pushed into the connecting element 9 until only the contact plug 17 projects from the connecting element 9 or the contact socket 43 lines up precisely with the connecting element 9.

In a tenth method step $S_{10}$, the connecting element 9 is introduced into an aperture 3 of the housing 2 of the calibration unit 1.

In an eleventh method step $S_{11}$, the connecting element 9 is soldered and/or glued to the housing in an electrically conductive manner at its first segment 10.

Within the scope of the invention, all of the features described and/or illustrated can be combined with one another as required. The calibration unit 1 is suitable for all coaxial connectors and for all types of measurement devices which provide coaxial connecting ports. By reducing the dimensions, the calibration unit can also be used for frequencies above 110 GHz.

The calibration unit 1 according to the invention can be embodied as a male connector and also as a female connector. In the case of an embodiment as a female connector, the inner conductor 15 comprises a contact socket 43. In this case, the union nut 8, the groove 6 and the snap ring 7 at the calibration unit 1 are omitted, and the housing 2 is provided with an additional thread.

The invention claimed is:

1. A connector apparatus comprising:
    a housing and an inner conductor, wherein the inner conductor is positioned approximately centered within an aperture of the housing; and
    a connecting element positioned within the aperture of the housing,
    wherein the connecting element comprises at least one narrowing or conical tapered segment that is configured in a manner whereby it supports the entire inner conductor in a flexible manner relative to the housing,
    wherein the connecting element hosts the entire inner conductor elastically in a relatively centered position providing for a same distance relative to an outer conductor, such that a minimal, if any, variance in a wave impedance occurs, and
    wherein the connector apparatus is configured for a connection with a connector structured in a relatively coaxial form.

2. The connector apparatus according to claim 1, wherein a first segment of the connecting element is embodied as one or more of a flange or a cowl, and is one or more of glued, pressed or soldered to the housing in an electrically conductive manner, and wherein the housing is electrically conductive or is coated with at least one electrically conductive layer, and wherein the connecting element comprises an electrically conductive material.

3. The connector apparatus according to claim 1, wherein a second segment of the connecting element comprises an internal diameter, which corresponds to an internal diameter of an outer conductor of the connector with which the connector apparatus is configured to be connected.

4. The connector apparatus according to claim 1, wherein a third segment of the connecting element is embodied in a narrowing, conical manner, whereby the connecting element tapers in its diameter.

5. The connector apparatus according to claim 1, wherein a fourth segment of the connecting element serves as a hosting element for the inner conductor.

6. The connector apparatus according to claim 1, wherein the connector apparatus is further configured for use in loading states comprising one or more of "open", or "short" or "match".

7. The connector apparatus according to claim 6, wherein the inner conductor comprises at least two segments in the loading states "open" and "match", wherein a second of the segments of the inner conductor comprises a dielectric, which, in the case of the loading state "match" is partially coated with one of a thin-film resistor or a thick-film resistor, and an electrically conductive material.

8. The connector apparatus according to claim 7, wherein a first of the segments of the inner conductor comprises a borehole, into which the second segment of the inner conductor is inserted, and wherein both the first and second segments are configured to be electrically connected to one another.

9. The connector apparatus according to claim 8, wherein an end of the second segment of the inner conductor not connected to the first segment is one or more of glued, soldered or clamped to the connecting element.

10. The connector apparatus according to claim 1, wherein the connecting element comprises an electrically conductive material and connects the inner conductor to the housing in an electrically conductive manner.

11. The connector apparatus according to claim 1, wherein the inner conductor is embodied, at an end not connected to the connecting element, as one of a contact plug or a contact socket.

12. The connector apparatus according to claim 11, wherein the end of the inner conductor not connected to the connecting element is embodied as a contact socket and is slotted, and its diameter is embodied in a conical manner.

13. A method for manufacturing a connector apparatus, the method comprising:
    electroplating a forming template which represents a negative shape of a connecting element; and
    performing one or more of etching away the forming template or peeling the connecting element off the forming template,
    wherein the connecting element comprises at least one narrowing or conical tapered segment that is configured in a manner whereby it hosts and supports an entire inner conductor of the connector apparatus in a flexible manner relative to a housing, and
    wherein the inner conductor is positioned relatively centered within an aperture of the housing providing for a same distance relative to an outer conductor, such that a minimal, if any, variance in a wave impedance occurs, and
    wherein the connector apparatus is configured for a connection with a connector structured in a relatively coaxial form.

14. The method according to claim 13, further comprising:
    manufacturing at least a first segment of the inner conductor via a lathing process; and
    performing one or more of electroplating or sputtering the lathed first segment of the inner conductor.

15. The method according to claim 14, wherein the method further comprises:
    performing one of pressing, sintering or lathing a second segment of the inner conductor with dielectric properties;
    applying in sections one of a thin-film resistor or a thick-film resistor, and an electrically conductive layer to the second segment of the inner conductor;
    trimming the thin-film resistor or the thick-film resistor applied to the second segment of the inner conductor by means of a laser;
    performing one or more of soldering or gluing the second segment of the inner conductor to the first segment of the inner conductor.

16. The method according to claim 15, further comprising:
    inserting one of the inner conductor or the first and second segments of the inner conductor into the connecting element;
    inserting the connecting element into the aperture of the housing;
    performing one or more of soldering or gluing the connecting element to the housing.

17. The method according to claim 13, wherein the connecting element connects the inner conductor to the housing in an electrically conductive manner.

* * * * *